(12) United States Patent
Ibusuki

(10) Patent No.: US 7,261,984 B2
(45) Date of Patent: Aug. 28, 2007

(54) EXPOSURE PATTERN OR MASK AND INSPECTION METHOD AND MANUFACTURE METHOD FOR THE SAME

(75) Inventor: Hironori Ibusuki, Tokyo (JP)

(73) Assignee: Sony Corporation (JP)

( * ) Notice: Subject to any disclaimer, the term of this patent is extended or adjusted under 35 U.S.C. 154(b) by 523 days.

(21) Appl. No.: 10/780,667

(22) Filed: Feb. 19, 2004

(65) Prior Publication Data

US 2004/0209171 A1 Oct. 21, 2004

(30) Foreign Application Priority Data

Feb. 21, 2003 (JP) ............................ P2003-043449

(51) Int. Cl.
*G03F 9/00* (2006.01)
*G06K 9/00* (2006.01)
(52) U.S. Cl. .................. 430/30; 382/144; 382/145; 382/149
(58) Field of Classification Search .................. 430/30; 382/144, 145, 149
See application file for complete search history.

(56) References Cited

U.S. PATENT DOCUMENTS 5,831,272 A    11/1998    Utsumi 6,855,997 B2    2/2005    Suwa

OTHER PUBLICATIONS

EPL: Electron-beam Proximity Lithography, "Projection Exposure with Variable Axis Immersion Lenses: A High-Throughput Electron Beam Approach to Suboptical Lithography" H.C Pfeiffer, Jpn. J. Appl. Phys. vol. 34 (1995) pp. 6658-6662.
LEEPL: Low Energy Electron-beam Proximity Projection Lithography, Characterization of a Process Development Tool for Ion Projection Lithography, Hans Loeschner, et al, J.Vac. Sci. technol. B19, (2001).

*Primary Examiner*—Christopher G. Young
(74) *Attorney, Agent, or Firm*—Rader Fishman & Grauer PLLC; Ronald P. Kananen

(57) ABSTRACT

An exposure pattern or mask inspection and manufacturing method and an exposure pattern or mask are provided which can perform comparison inspection of the exposure pattern or mask with ease and at a high precision. A mask pattern portion for exposing a predetermined pattern by an exposure beam is inspected by disposing a plurality of dummy inspection patterns having the same pattern as at least a part of the mask pattern portion inside and/or outside an area of the mask pattern portion and comparing at least the portion of the mask pattern portion with the dummy inspection pattern portion or portions.

15 Claims, 15 Drawing Sheets

DIE TO DIE

X-X' CROSS SECTION

X-X' CROSS SECTION

EXPOSURE PATTERN OR MASK AND INSPECTION METHOD AND MANUFACTURE METHOD FOR THE SAME

CROSS REFERENCE TO RELATED APPLICATIONS

The present document is based on Japanese Priority Document JP2003-043449, filed in the Japanese Patent Office on Feb. 21, 2003, the entire contents of which are incorporated herein by reference.

BACKGROUND OF THE INVENTION

1. Field of the Invention

The present invention relates to an exposure pattern or mask suitable for use in an electron beam exposure process and to an inspection method and a manufacturing method for an exposure pattern or mask.

2. Description of Related Art

Miniaturization of recent semiconductor devices advances further and exceeds the limit of a resolution of an optical lithography system. In order to overcome this, fine patterning techniques have been developed which use a charged particle beam, such as an electron beam, and an ion beam to expose and draw a micro circuit pattern.

A conventional, direct drawing method utilizing electron beam exposure, however, requires a large amount of data when micro patterns are used for an LSI (large scale integrated) circuit having a high integration density. This results in a long drawing time and a low productivity (throughput).

In order to address this drawback, an electron beam aligner or an ion beam aligner has been proposed which irradiates an electron beam or an ion beam to a transfer mask to form a circuit pattern on a wafer with the beam passed through through holes (pattern openings) of the transfer mask.

Exposure techniques of this type include, for example, an electron beam projection lithography using a high energy electron beam (refer to EPL: Electron-beam Proximity Lithography, H. C. Pfeiffer, Jpn. J. Appl. Phys. 34, 6658 (1995)), a low energy electron beam proximity projection lithography using a low energy electron beam (refer to LEEPL: Low Energy Electron-beam Proximity Projection Lithography, T. Utsumi, U.S. Pat. No. 5,831,272 (3, Nov. 1998)), an ion beam projection lithography using an ion beam (refer to IPL: Ion-beam Lithography, H. Loeschner et al., J. Vac. Sci. Technol. B19, 2520 (2001)), and other techniques.

An electron beam transmission mask (projection mask) used with these aligners, e.g., an LEEPL stencil mask, has a structure such as that shown in the plan view of FIG. 10A and the cross sectional view of FIG. 10B taken along line X-X' shown in FIG. 10A. This stencil mask 67 has a membrane (thin film) having a thickness of 100 nm to 10 μm and formed with pattern openings 59. For example, the membrane (thin film) 51 of the stencil mask 67 having a thickness of 100 nm to 10 μm in thickness has a plurality of through holes (pattern openings) 59 having a width of 0.03 μm to 0.04 μm through which an electron beam is transmitted. In FIGS. 10A and 10B, only several pattern openings 59 are drawn for the purposes of drawing simplicity. The membrane 51 is supported by a silicon (Si) wafer (support substrate) 56. The Si wafer 56 is formed on an $SiO_2$ film 55 formed around and outside the pattern openings 59 and having an opening 61 of 20 to 40 mm in diameter and has an opening 60 larger in size than the opening 61 of the $SiO_2$ film 55.

As shown in FIG. 11, in an exposure process using the stencil mask 67, for example, the stencil mask 67 is disposed on a photoresist layer 57 formed on a wiring material layer 54 to be patterned, the wiring material layer being formed on an $SiO_2$ film 55 on a semiconductor substrate 58. In this state, an electron beam 71 is emitted and passed through the pattern openings 59 of the membrane 51 of the stencil mask 67 to expose the photoresist layer 57 in a predetermined pattern. A photoresist pattern 57 left through development is used as a mask to dry etch the wiring material layer 54 and form a wiring pattern.

If the stencil mask 67 has, for example, a rectangular ring pattern opening 59 such as shown in FIG. 12A, a central area 51a serving as an electron beam absorber area falls out and cannot maintain the pattern opening. If the stencil mask has a leaf-shaped opening pattern (not shown), the shape of the opening pattern cannot be maintained stably, because this opening pattern is of a cantilever structure. These pattern openings are unable to be formed or difficult to be formed.

In order to form an object pattern opening 59 on a wafer, a so-called complementary division method has been introduced. Namely, the pattern opening 59 is geometrically divided into two masks 67A and 67B having divided opening patterns 59A and 59B, respectively, as shown in FIG. 12B, and are complementarily overlaid on the wafer, as shown in FIG. 12C.

FIGS. 13A to 14C illustrate a process of fabricating the stencil mask 67. As shown in FIG. 13A, on an Si wafer (support substrate) 56, an $SiO_2$ film 55 and a membrane 51 made of Si or SiC are sequentially deposited to predetermined thicknesses.

As shown in FIG. 13B, a resist layer 63 having a predetermined pattern is formed on the Si wafer 56. A partial region of the Si wafer 56 is removed down to the surface of the $SiO_2$ film 55 by dry etching to form an opening 60 and a support column 70 which partitions each mask quadrant.

As shown in FIG. 13C, after the resist pattern 63 is removed, by using the Si wafer 56 and support column 70 as a mask, a partial region of the $SiO_2$ film 55 is removed down to the surface of the membrane 51 by dry etching to form an opening 61.

As shown in FIG. 14A in the up-side-down state of FIG. 13C, a resist layer 63 is formed on the membrane 51 and processed to have a predetermined pattern.

More specifically, openings 64 are formed through the membrane 51 to form a mask pattern portion 62 above the openings 60 and 61.

Next, as shown in FIG. 14B, by using the resist pattern 63 as a mask, the membrane 51 is dry etched to form through holes in the area corresponding to the mask pattern portion 62 to thereby form mask pattern openings 66.

Thereafter, as shown in FIG. 14C, the resist pattern 63 on the membrane 51 is removed so that a stencil mask 67 can be formed.

It is important to inspect whether the stencil mask has the pattern openings 66 just as designed.

In one example of a mask inspection apparatus and method, by utilizing an electron beam aligner without utilizing an additional inspection apparatus, it is possible to inspect whether there is any defect of a mask. {Refer to Patent Document 1: Japanese Unexamined Patent Publication No. 2001-153637 (p. 3, 28th line in right column to p. 5, 2nd line in right column, FIG. 2)}

In another example of a mask inspection apparatus and method, a mask pattern defect is inspected in the following manner. The mask pattern that is to be inspected is two-dimensionally scanned with an electron beam to obtain mask pattern transmission electric signals. From these electric signals, a mask pattern signal corresponding to the shape of the mask pattern is obtained. This mask pattern signal is compared with the CAD (Computer Aided Design) signal corresponding to a CAD figure to be used for mask pattern fabrication, and based upon this comparison result, the mask pattern defect is inspected. {Refer to Patent Document 2: Japanese Unexamined Patent Publication No. 2002-71331 (p. 3, 49th line in left column to p. 4, 21st line in right column, FIG. 1)}

Another inspection uses a reticle (optical mask or photomask) and its layout method of the following type. For example, each of a plurality of shots constituted of a plurality of different chips is disposed on a reticle in such a manner that all or some of chips having the same pattern are aligned along a row or column direction or directions to inspect the mask. (Refer to Patent Document 3: Japanese Unexamined Patent Publication No. HEI-10-73916 (p. 3, 41st line in left column to p. 4, 3rd line, FIG. 1))

SUMMARY OF THE INVENTION

In both the inspection methods described in Patent Document 1 (Japanese Unexamined Patent Publication No. 2001-153637) and Patent Document 2 (Japanese Unexamined Patent Publication No. 2002-71331), a stencil mask is inspected by a "Die to Data" method by which a pattern image of pattern openings is detected by irradiating an electron beam to the stencil mask and thereafter the pattern image is compared with design CAD data or the like. With these methods, however, since the amount of data is large, the inspection takes a long time. In addition, since comparison evaluation of the real pattern is performed by using the data in a database, this approach is indirect and not accurate.

Detailed and particular LEEPL stencil mask inspection methods and apparatuses are still not established yet.

In the meantime, it is necessary to prepare a dedicated reticle inspection apparatus for a reticle inspection. The reticle inspection methods include a chip comparison inspection method by a "Die to Die" method and a chip-data comparison inspection method by a "Die to Data" method which inspects a reticle through a comparison between a real mask pattern and design CAD data or the like.

The chip comparison inspection method disclosed in Patent Document 3 (Japanese Unexamined Patent Publication No. HEI-10-73916) inspects a reticle (optical mask) by the Die to Die method. This method can inspect a reticle only if shots contain the chips having the same pattern.

Since this comparison inspection method requires alignment of the chips having the same pattern along the row or column direction, the degree of freedom of the chip layout on a mask is lowered.

Different from a reticle, a stencil mask for LEEPL or the like uses a silicon wafer that is the same as that used for manufacturing semiconductor devices. There is therefore a high possibility that inspection can be performed by using a general silicon wafer inspection apparatus. If a wafer defect inspection apparatus widely used in inspecting a semiconductor device can be used for the inspection of stencil masks for LEEPL or the like, it presents large merits in terms of data reliability and availability to both the wafer and mask inspection apparatuses.

Exposure using a stencil mask is of an equal magnification projection type. Because of restrictions such as the mask pattern size, it is difficult to perform a comparison inspection by the Die to Die method.

This difficulty will be detailed. As shown in FIG. 15, a stencil mask 67, for example, for LEEPL, has a mask pattern portion 62 made of a membrane (thin film) 51 formed in a central area of an Si wafer (support substrate) 56 having a size of, for example, 4 to 8 inches.

The mask pattern portion 62 (membrane 51) is the area in and toward which an electron beam can be irradiated reliably. This area is defined in a range of, for example, about 4 square cms and partitioned-into four sections: a first quadrant 52A, a second quadrant 52B, a third quadrant 52C and a fourth quadrant 52D. One sectional area corresponds to the area of one chip. Stepper exposure of an electron beam is executed by moving the stencil mask 67 relative to an exposure object (semiconductor substrate) sequentially from the first quadrant 52A to fourth quadrant 52D.

Exposure by an electron beam is therefore four cumulative shots exposure in total. The size of one shot (one chip) corresponds, therefore, to each area of the first quadrant 52A, the second quadrant 52B, the third quadrant 52C and the fourth quadrant 52D, i.e., a one-fourth area (about 2 square cms) of the membrane 51 (mask pattern portion 62).

Under this circumstance, it is probably difficult in terms of size to dispose a plurality of dies (semiconductor chips) having the same pattern in the one shot small area (quadrant) of about 2 square cms and to perform inspection by the Die to Die method. Namely, the comparison inspection by the Die to Die method is difficult, unless three or more dies are formed in one shot.

If the die has a size of, for example, about 7 square mms or smaller whose side length is one third of that of about 2 square cms, it is possible to dispose three or more dies having the same pattern in one quadrant. Demands for chips having such a small size are, however, reducing in practical use.

If a plurality of dies cannot be disposed in one shot of the mask pattern portion 62 (i.e., if the comparison inspection by the Die to Die method is impossible), inspection of an LEEPL stencil mask utilizing a wafer defect inspection apparatus is not easy. Although this problem is irrelevant to the Die to Data method, comparison inspection by this method is more indirect than the Die to Die method, and a direct and accurate inspection of a real pattern is not possible.

BRIEF SUMMARY OF THE INVENTION

The present invention has been made under the above-described circumstances. According to an embodiment of the present invention, there is provided an exposure pattern or mask inspection method capable of performing an exposure pattern or mask comparison inspection with ease and at a high precision, a manufacturing method, for an exposure pattern or a mask and an exposure pattern or a mask.

The present invention relates to an inspection method for an exposure pattern or mask, to an exposure pattern or mask manufacturing method adopting the inspection method of this kind, and to an exposure pattern or mask having inspection pattern portions. The manufacturing and inspection method of manufacturing and inspecting an exposure pattern or mask for exposing a predetermined pattern by an exposure beam includes the steps of: disposing a plurality of inspection pattern portions (particularly dummy inspection pattern portions to be described later: the same reference is applied hereinafter) having the same pattern as at least a part of a mask pattern portion, inside and/or outside an area of the mask pattern portion of the exposure pattern or mask (e.g., LEEPL stencil mask pattern or mask: the same reference is applied thereinafter); and comparing one or more of the inspection patterns with at least the portion of the mask pattern portion.

According to the invention, a plurality of inspection pattern portions having the same pattern as at least a part of a mask pattern portion are disposed inside and/or outside an area of the mask pattern portion of the exposure pattern or mask, and one or more of the inspection patterns are compared with at least the portion of the mask pattern portion. Accordingly, the mask pattern portion can be compared directly with the inspection pattern or patterns so that the pattern inspection precision can be improved, comparison inspection by the Die to Die method among others becomes possible, and comparison inspection can be performed with ease and at a high reliability by using a general, wafer defect inspection apparatus.

Furthermore, since a plurality of inspection pattern portions having patterns suitable for comparison inspection can be disposed inside and/or outside an area of the mask pattern portion of the exposure pattern or mask, the degree of freedom of the layout of inspection patterns can be improved more than the layout of dies having the same pattern in the mask pattern portion. Still further, the comparison inspection precision can be improved by increasing the number of inspection patterns.

BRIEF DESCRIPTION OF THE DRAWINGS

The above and other objects, features and advantages of the present invention will become more apparent from the following description of the presently preferred exemplary embodiments of the present invention taken in conjunction with the accompanying drawings, in which.

DESCRIPTION OF THE PREFERRED EMBODIMENTS

According to the invention, in order to improve the reliability of comparison inspection, it is preferable to set the number of inspection pattern portions to twofold or more of the number of areas of at least the portion of the mask pattern.

In order to facilitate the comparison inspection, it is preferable to dispose the inspection pattern portions near the mask pattern portion.

The mask pattern portion is formed by forming through holes having a predetermined pattern through a thin film through which the exposure beam passes, and the inspection patterns are preferably formed in the form of recesses in order to prevent the exposure beam from transmitting through the exposure pattern or mask.

To this end, it is preferable that the mask pattern portion is formed by using the thin film and the inspection pattern portions are formed by using the thin film on a support substrate.

At least the portion of the mask pattern portion and the inspection pattern portion or portions are optically detected and detected information is compared.

Inspection of the mask pattern portion can be performed by a chip comparison inspection (inspection by the Die to Die method) or a cell comparison inspection (inspection by the Cell to Cell method).

The manufacture conditions are preferably controlled by the result of the comparison inspection, in order to manufacture the exposure pattern or mask at a high precision.

Preferred embodiments of the invention will be described specifically with reference to the accompanying drawings.

First Embodiment

In this embodiment, as shown in FIGS. 1A to 3C, a plurality of dummy inspection pattern portions 3 are disposed near to, or next to, a mask pattern portion 16 (membrane). The dummy inspection pattern portion 3 has the same pattern as that of the mask pattern portion 16, and the mask pattern portion 16 is defined in the central area of an Si wafer (support substrate) 6 constituting a stencil mask 7, for example, for LEEPL (Low Energy E-beam Proximity Projection Lithography)

Figure 4A:
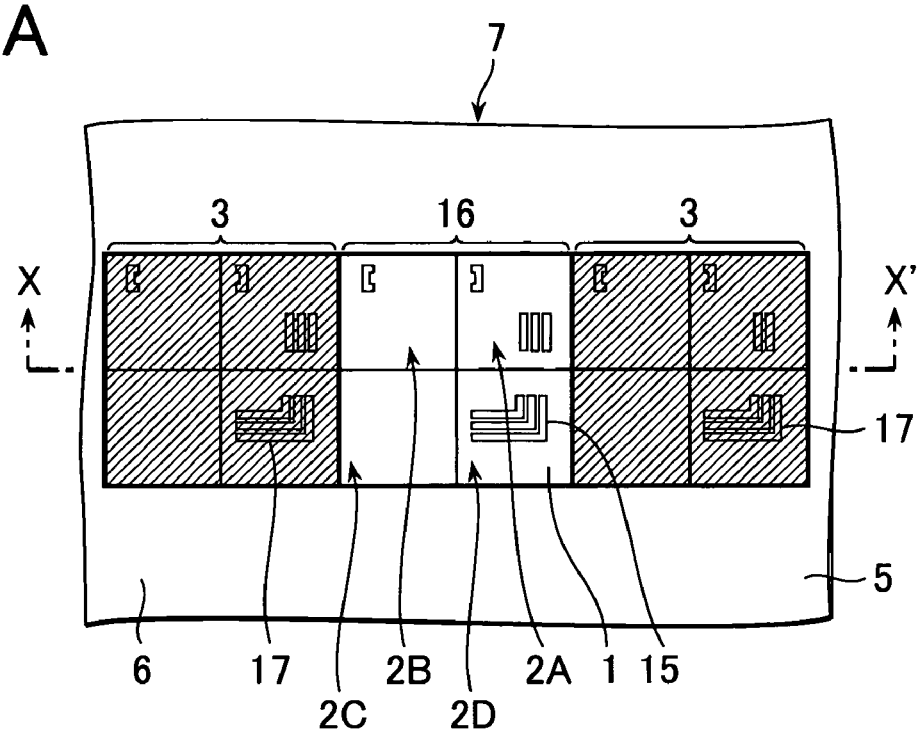
FIG. 4A is a partially enlarged plan view of a stencil mask according to the first embodiment.
Figure 4B:
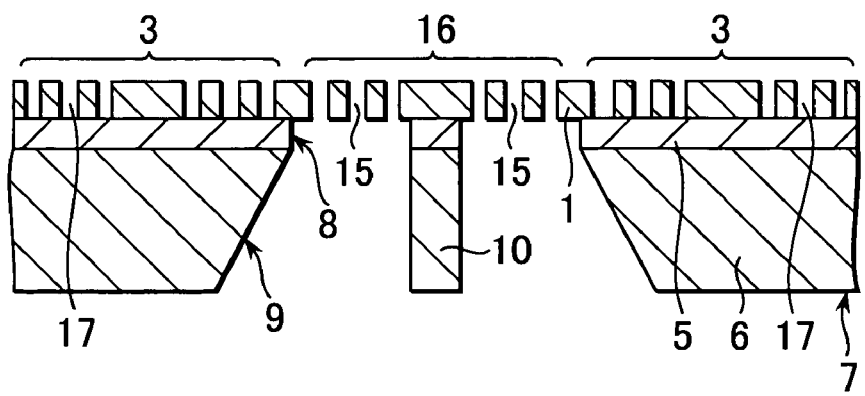
FIG. 4B is a cross sectional view taken along line X-X' shown in FIG. 4A.

As shown in FIGS. 4A and 4B, since each dummy inspection pattern portion 3 is used as a dummy for inspection of the mask pattern portion 16, as will be later described, the dummy inspection pattern portion 3 is not necessary to have through holes formed through a thin film, as in the case of the mask pattern portion 16. Instead, the dummy inspection pattern portion 3 may have recesses (excavated structures through etching) having the same pattern as that of the mask pattern portion 16 and formed in partial regions on the Si wafer 6.

Figure 1A:
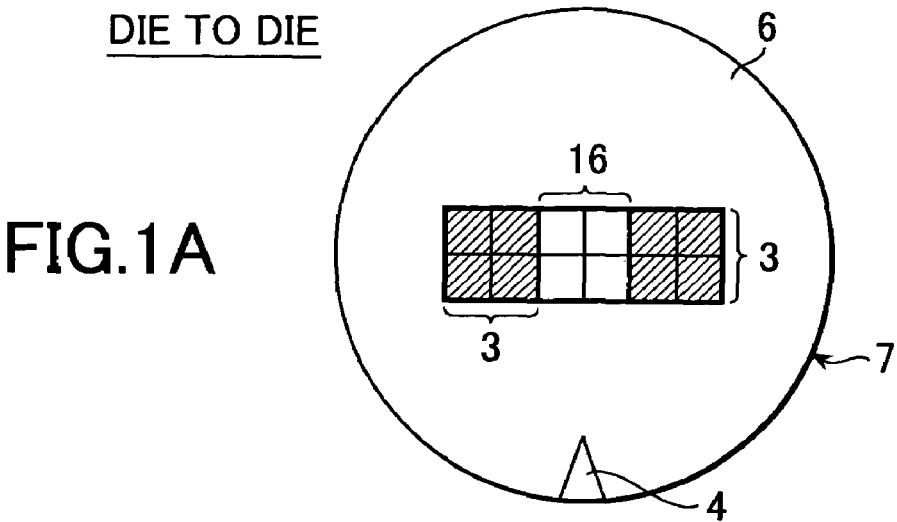
FIGS. 1A, 1B and 1C are schematic plan views of stencil masks having dummy inspection pattern portion or portions according to a first embodiment of the present invention.

The stencil mask 7 shown in FIG. 1A has two dummy inspection pattern portions 3 formed on the Si wafer 6 next to and to the right and left of, as viewed from an orientation mark 4, the mask pattern portion 16 in the central area of the Si wafer 6.

With this layout, inspection by the Die to Die method can be performed on the Si wafer 6 through comparison of one mask pattern portion 16 with two dummy inspection pattern portions 3.

Although the dummy inspection pattern portions 3 are drawn next to the mask pattern portion 16, as shown in FIGS. 4A and 4B, they are actually disposed spaced apart by a predetermined distance from the mask pattern portion 16, and a support column 10 is formed on the back side of the mask pattern portion 16, in order to retain the mechanical strength of the stencil mask 7. Each quadrant of the mask pattern portion 16 and dummy inspection pattern portions 3 is distinguishably indicated by narrow lines.

Figure 1B:
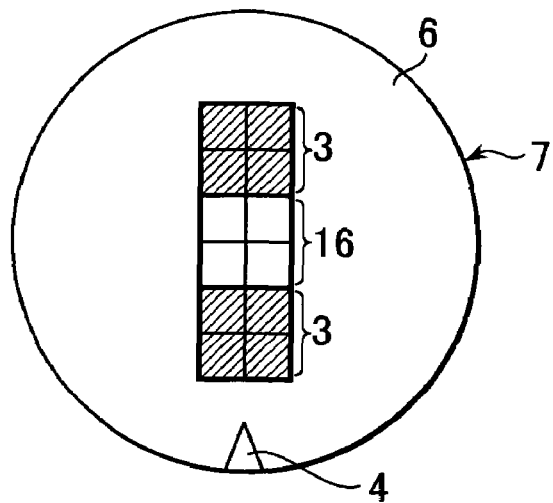

The stencil mask 7 shown in FIG. 1B has two dummy inspection pattern portions 3 formed next to and on the upper and lower sides of, as viewed from the orientation mark 4, the mask pattern portion 16 in the central area of the Si wafer 6.

Figure 1C:
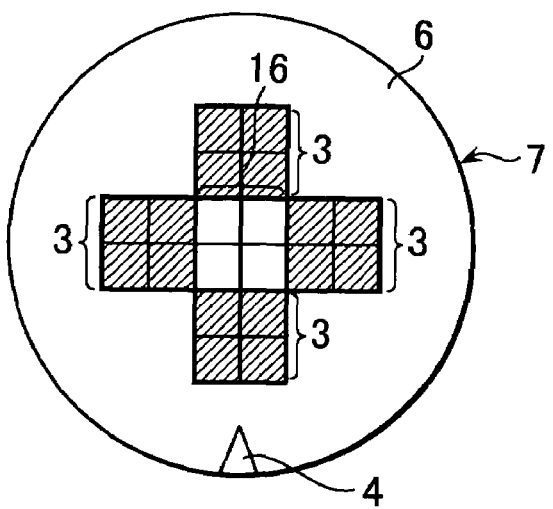

The stencil mask 7 shown in FIG. 1C has four dummy inspection pattern portions 3 next to, to the right and left of, and on the upper and lower sides of, as viewed from the orientation mark 4, the mask pattern portion 16 in the central area of the Si wafer 6.

With this layout, a defect can be inspected more reliably because one mask pattern portion 16 can be compared with four dummy inspection pattern portions 3.

Figure 2A:
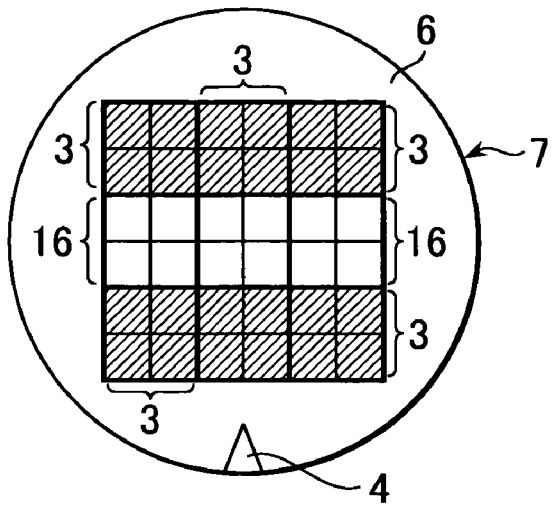
FIGS. 2A, 2B and 2C are schematic plan views of other stencil masks according to the first embodiment.

The stencil mask 7 shown in FIG. 2A has two mask pattern portions 16 next to, and to the right and left of, as viewed from the orientation mark 4, the mask pattern portion 16 in the central area of the Si wafer 6, and has two sets of three dummy inspection pattern portions next to, and on the upper and lower sides of, the three mask pattern portions 16.

With this layout, even if the mask pattern of each mask pattern portion 16 is the same or different, the defect inspection can be performed effectively relative to the upper and lower inspection pattern portions 3 at the number ratio of 1:2.

Figure 2B:
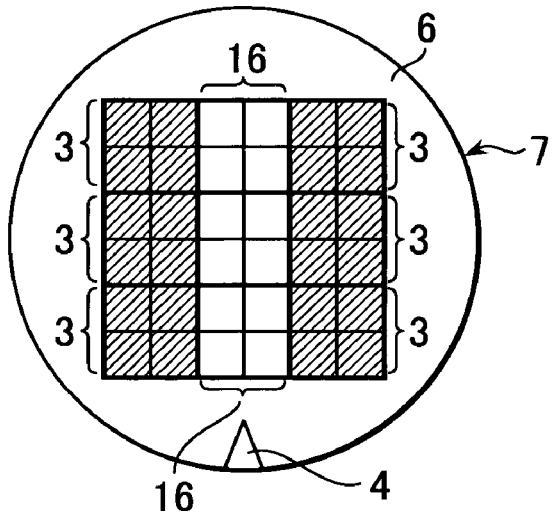

The stencil mask 7 shown in FIG. 2B has two mask pattern portions 16 next to, and on the upper and lower sides of, as viewed from the orientation mark 4, the mask pattern portion 16 in the central area of the Si wafer 6, and has two sets of three dummy inspection pattern portions 3 next to, and to the right and left of, the three mask pattern portions 16.

With this layout, similar to the stencil mask 7 shown in FIG. 2A, even if the mask pattern of each mask pattern portion 16 is the same or different, the defect inspection can be performed effectively.

Figure 2C:
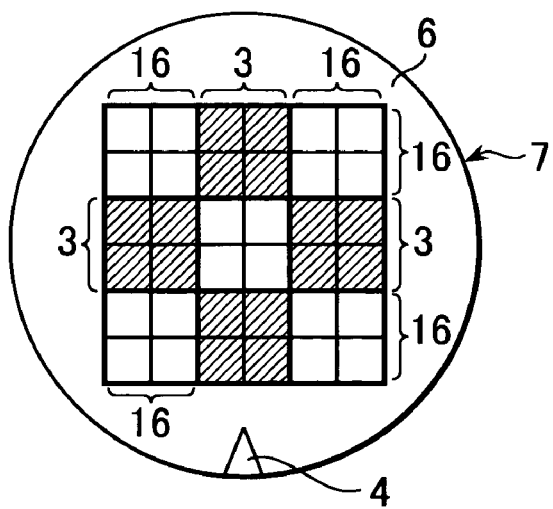

The stencil mask 7 shown in FIG. 2C has four dummy inspection pattern portions 3 next to, on the upper and lower sides of, and to the right and left of, as viewed from the orientation mark 4, the mask pattern portion 16 in the central area of the Si wafer 6, and has four mask pattern portions 16 next to, on the diagonally upper right and left of, and on the diagonally lower right and left of, the central mask pattern portion 16.

The ratio of the number of mask pattern portions 16 to the number of dummy inspection pattern portions 3 is 5:4. When the mask pattern portions 16 are to be sequentially inspected, the dummy inspection pattern portions 3 can be selected at the ratio of 1:2 or higher (e.g., 1:4).

Furthermore, for example, only the central mask pattern portion 16 may be used as an inspection object, and the other mask pattern portions 16 are used as reserved mask pattern portions. In this case, even if the central mask pattern portion 16 has a low pattern precision and cannot be used practically, another reserved mask pattern portion 14 can be used in place of the defective mask pattern portion 16. It is therefore unnecessary to manufacture again a new stencil mask 7.

Figure 3A:
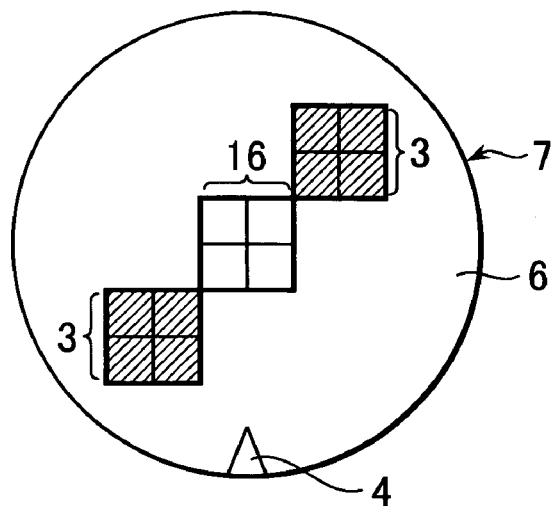
FIGS. 3A, 3B and 3C are schematic plan views of other stencil masks according to the first embodiment.

The stencil mask 7 shown in FIG. 3A has two dummy inspection pattern portions 3 next to, on the diagonally upper right of, and on the diagonally lower left of, as viewed from the orientation mark 4, the mask pattern portion 16 in the central area of the Si wafer 6.

With this layout, similar to the stencil masks shown in FIGS. 1A and 1B, the defect inspection of the mask pattern of one mask pattern portion 16 can be performed by using two inspection dummy patterns 3.

Figure 3B:
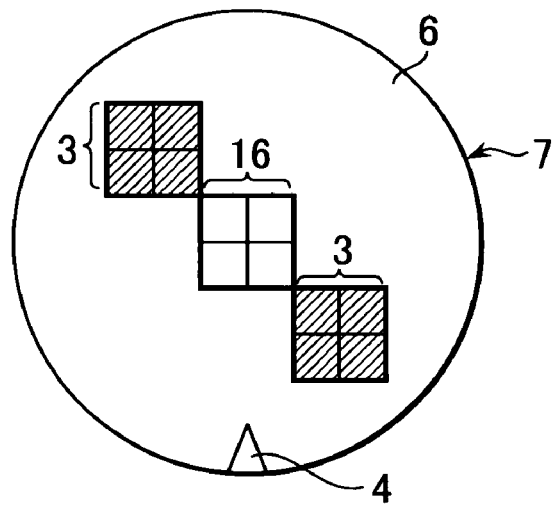

The stencil mask 7 shown in FIG. 3B has two dummy inspection pattern portions 3 next to, on the diagonally upper left of, and on the diagonally lower right of, as viewed from the orientation mark 4, the mask pattern portion 16 in the central area of the Si wafer 6.

Figure 3C:
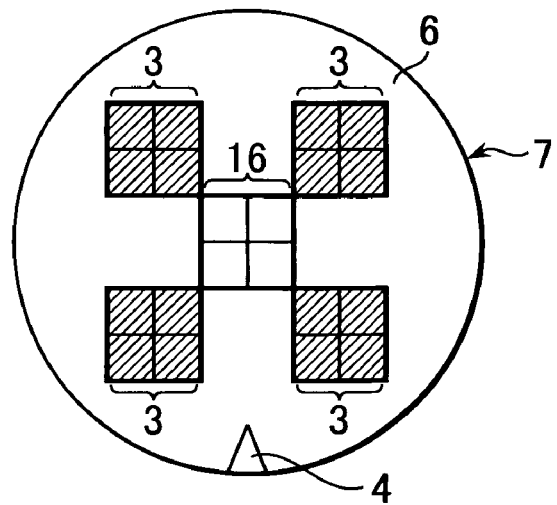

The stencil mask 7 shown in FIG. 3C has four dummy inspection pattern portions 3 next to, on the diagonally upper right and left of, and on the diagonally lower right and left of, as viewed from the orientation mark 4, the mask pattern portion 16 in the central area of the Si wafer 6.

With this layout, similar to the stencil mask shown in FIG. 1C, the defect inspection of the mask pattern of one mask pattern portion 16 can be performed by using four inspection dummy patterns 3, resulting in a more accurate defect inspection.

As shown in the plan view of FIG. 4A and the cross sectional view of FIG. 4B taken along line X-X' shown in the plan view, each of the stencil masks 7 described above, e.g., the stencil mask 7 shown in FIG. 1A, has the mask pattern portion 16 having first to fourth quadrants 2A, 2B, 2C and 2D and made of a membrane or thin film 1 (corresponding to the previously described membrane 51). In order to make it easy to understand, only several pattern openings 15 are drawn in a simplified shape.

The dummy inspection pattern portions 3 are disposed next to and to the right and left of the mask pattern portion 16 and formed in the membrane 1 on the Si substrate 6. The dummy inspection pattern portion 3 has inspection pattern openings 17 in the form of recesses having the same pattern as that of the mask pattern portion 16.

The membrane 1 having the mask pattern portion 16 is supported by the Si wafer (support substrate) 6 via an $SiO_2$ film 5 having an opening 8 formed around the pattern openings 15, the Si wafer 6 has an opening 9 larger than that of the opening 8 of the $SiO_2$ film. Since the membrane 1 is a thin film and is liable to breakage, the membrane 1 is reinforced by disposing a support column 10 on the membrane 1 on the side of the opening 8.

The dummy inspection pattern portions 3 disposed next to the mask pattern portion 16 do not have a thin film membrane structure, but they have the excavated structures formed by etching the membrane 1 on the support substrate Si wafer 6 down to the surface of the $SiO_2$ film 5 to form the inspection pattern openings 17 having the same pattern as that of the mask pattern portion 16.

If the thickness of the membrane 1 is, for example, 0.5 μm, it is preferable to set the depth of the openings 17 in the dummy inspection pattern portion 3 to 0.5 µm, the same as the thickness of the membrane 1, in order to use the same etching conditions (i.e., the same patterning precision) as those for the comparison inspection openings 15.

The structure made of only the thin film membrane 1 is only in the mask pattern portion 16, and the dummy inspection pattern portions 3 are supported by the Si wafer 6. When an electron beam is emitted, the incident beam to the inspection pattern openings 17 of the dummy inspection pattern portions 3 is intercepted by the Si wafer 6 and the like, and thus the beam does not transmit through the Si wafer 6. Accordingly, the stencil mask 7 has a strong mechanical strength and can prevent unnecessary transmission of an electron beam.

Figure 5A:
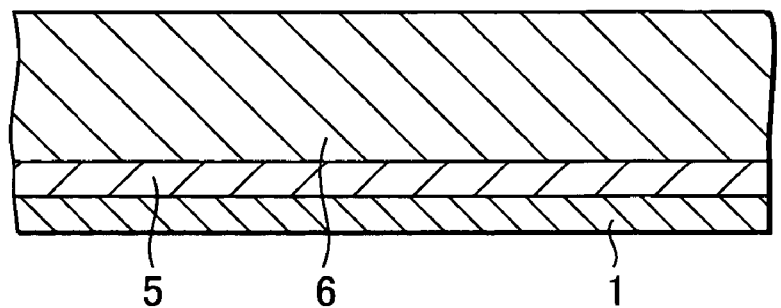
FIGS. 5A to 5C are cross sectional views illustrating stencil mask fabrication processes in sequence according to the first embodiment.

Next, the manufacturing processes for the stencil mask 7 will be described by way of an example with reference to FIGS. 5A to 6C. First, as shown in FIG. 5A, on an Si wafer (support substrate) 6, an $SiO_2$ film 5 and a membrane 1 made of Si or SiC are sequentially deposited to predetermined thicknesses.

Figure 5B:
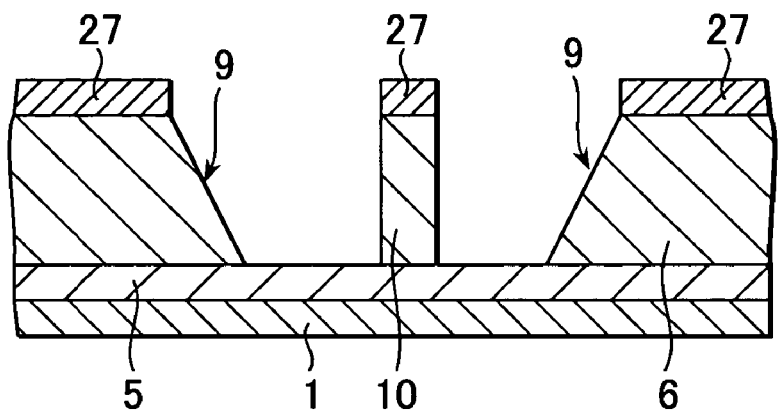

As shown in FIG. 5B, a resist layer 27 having a predetermined pattern is formed on the Si wafer 6. A partial region of the Si wafer 6 is removed down to the surface of the $SiO_2$ film 5 by dry etching to form an opening 9 and a support column 10.

Figure 5C:
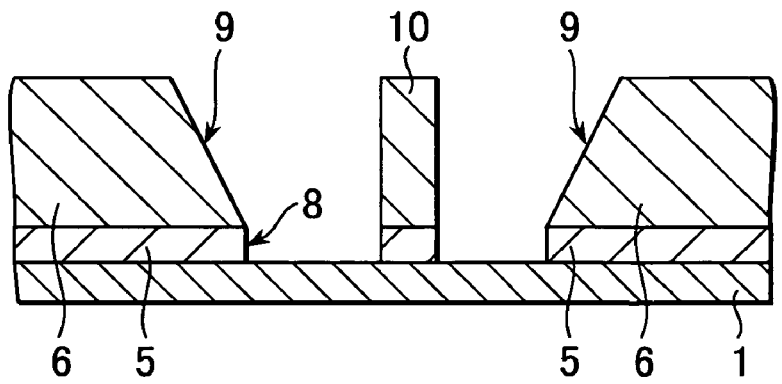

As shown in FIG. 5C, after the resist pattern 27 is removed, by using the Si wafer 6 and support column 10 as a mask, a partial region of the $SiO_2$ film 5 is removed down to the surface of the membrane 1 by dry etching to form an opening 8.

Figure 6A:
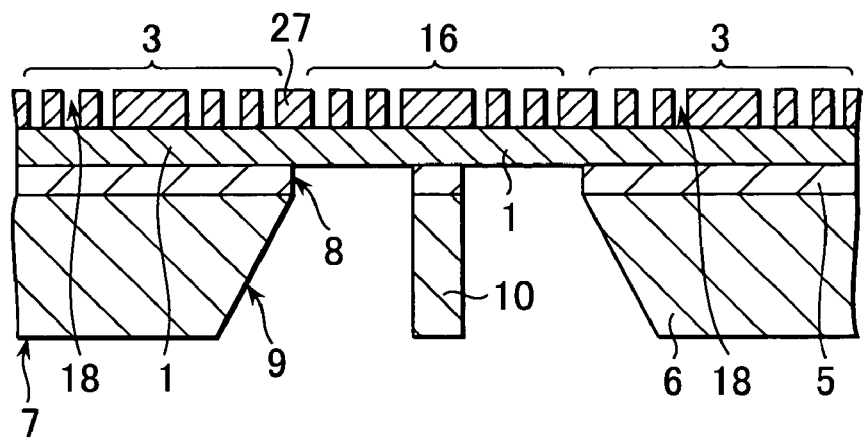
FIGS. 6A to 6C are cross sectional views illustrating stencil mask fabrication processes in sequence according to the first embodiment.

As shown in FIG. 6A in the up-side-down state of FIG. 5C, a resist layer 27 is formed on the membrane 1 and processed to have a predetermined pattern.

More specifically, openings 18 are formed through the resist pattern 27 in such a manner that a mask pattern portion 16 is formed in a partial area of the membrane 1 above the openings 8 and 9 and two dummy inspection pattern portions 3 are formed on the Si wafer 6 almost next to the mask pattern portion 16.

Figure 6B:
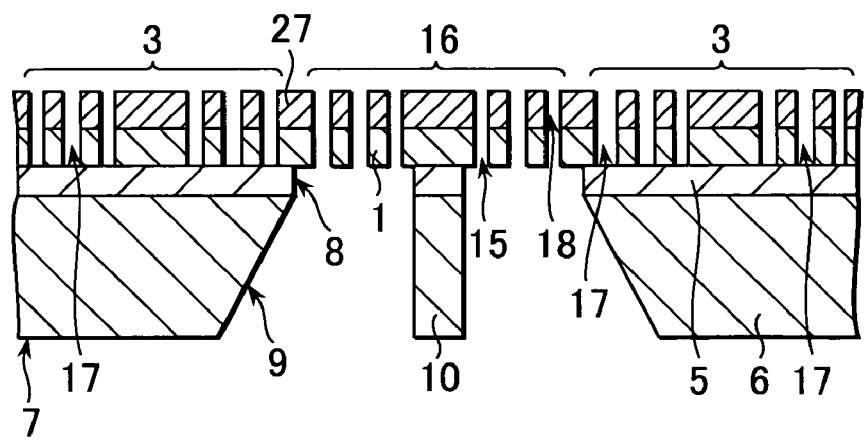

Next, as shown in FIG. 6B, by using the resist pattern 27 as a mask, the membrane 1 is dry etched to form through holes in the area corresponding to the mask pattern portion 16 to form thereby mask pattern openings 15 and, at the same time, to form inspection pattern openings or recesses 17 in the dummy inspection pattern portions 3, the recesses 17 reaching the surface of the $SiO_2$ film 5 and having the same pattern as that of the mask pattern portion 16.

Figure 6C:
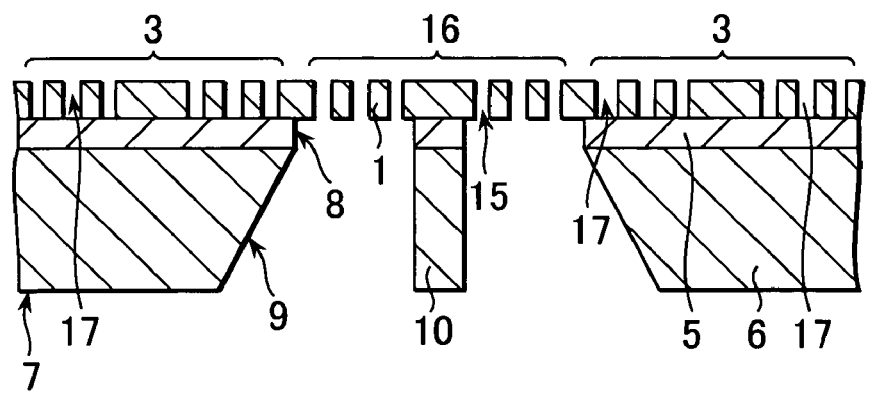

Thereafter, as shown in FIG. 6C, the resist pattern 27 on the membrane 1 is removed so that a stencil mask 7 shown in FIG. 4B can be formed.

Figure 7:
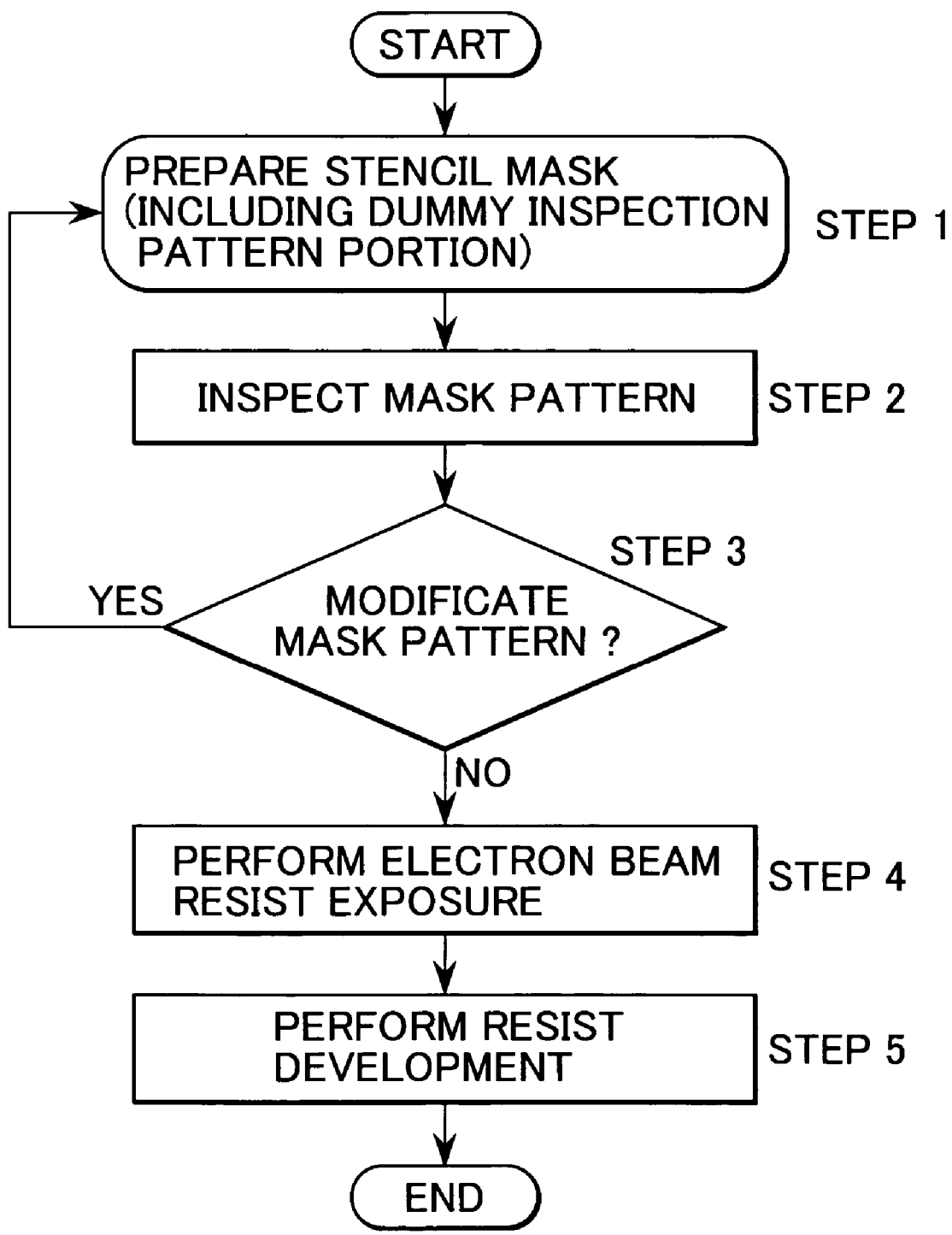
FIG. 7 is a flow chart illustrating an exposure process using a stencil mask according to the first embodiment.

FIG. 7 is a flow chart illustrating an exposure process using the stencil mask 7 of this embodiment.

First, a stencil mask 7, such as that shown in FIG. 4, is formed. In this case, the mask pattern portion 16 and dummy inspection pattern portions 3 are formed at the same time (Step 1).

Next, the defect inspection of the mask pattern portion 16 is performed through comparison inspection by the Die to Die method relative to the dummy inspection pattern portions 3 (Step 2).

If this defect inspection suggests any necessary modification of the pattern of the mask pattern portion 16, this information is fed back to the manufacture of the stencil mask 7 so that the stencil mask manufacturing conditions can be controlled. If modification is not necessary, the next process is executed (Step 3).

Any defect of the mask pattern portion 16 can be found by the comparison inspection in which the mask pattern portion 16 and dummy inspection pattern portions 3 are imaged at the same time to compare pattern images formed by light reflected from these pattern portions.

Next, an electron beam resist exposure is performed by using the stencil mask 7, which is unnecessary for the modification (Step 4), and then a resist development process (Step 5) is performed to thereafter terminate the exposure process.

As described above, according to the embodiment, a plurality of dummy inspection pattern portions 3 having the same pattern as that of the mask pattern portion 16 are disposed next to and in an area other than that of the mask pattern portion 16. The mask pattern portion 16 is compared with the dummy inspection pattern portions 3. Since the mask pattern portion 16 can be compared directly with the dummy inspection pattern portions 3 next to the mask pattern portion 16, the comparison inspection can be performed at a high precision.

A plurality of dummy inspection pattern portions 3 having the same pattern as that of the mask pattern portion 16 are disposed on the Si wafer 6 in an area different from the mask pattern portion 16. The degree of freedom of the layout of dummy inspection pattern portions 3 can therefore be expanded and the number of dummy inspection pattern portions 3 can be increased, so that the precision of the comparison inspection can be improved.

Since the mask pattern portion 16 and dummy inspection pattern portions 3 of the stencil mask 7 are formed at the same time, the manufacturing conditions are almost the same. Therefore, the pattern shapes of the mask pattern portion 16 and dummy inspection pattern portions 3 are almost the same, so that the precision of the comparison inspection is improved and the comparison inspection can be performed only by one stencil mask 7.

It may be considered that a plurality of the same stencil masks are formed and used as dummy stencil masks. An original stencil mask is compared with these dummy stencil masks to perform the comparison inspection by the Die to Die method. With this method, however, since it is difficult to manufacture a plurality of stencil masks under the same manufacturing conditions, each stencil mask has an in-plane irregular pattern. It is therefore difficult to manufacture a plurality of the same stencil masks.

According to the embodiment, a plurality of dummy inspection pattern portions 3 are disposed next to the mask pattern portion 16 made of only the membrane 1, so that the wafer defect inspection by the Die to Die method becomes possible. It is therefore possible to inspect a LEEPL stencil mask 7 with an ordinary, wafer defect inspecting apparatus with ease and at a good reliability. A die is one chip of the mask pattern portion 16, and the dummy inspection pattern portion having the same pattern as that of the mask pattern portion 16 is also a die corresponding to one chip.

It is important that two or more dummy inspection pattern portions 3 are formed for each mask pattern portion 16 to have a number ratio of 1:2 or larger. If one dummy inspection pattern portion 3 is formed for one mask pattern portion 16 (a number ratio of 1:1), in the comparison inspection it is difficult to judge whether the defect is contained in the mask pattern portion 16 or in the dummy inspection pattern portion 3. By forming at least two dummy inspection pattern portions 3 for one mask pattern portion 16, it becomes apparent that the precision (or probability) of defect detection of the mask pattern portion 16 can be improved.

The dummy inspection pattern 3 has the recesses of the excavated structures formed by etching the membrane 1 above the Si wafer 6 to have a predetermined pattern. Therefore, the Si wafer 6 helps maintain the mechanical strength of the stencil mask 7, and, in addition, the Si wafer 6 prevents the exposure electron beam from transmitting through the dummy inspection pattern portion 3 during the exposure process.

Second Embodiment

Figure 8:
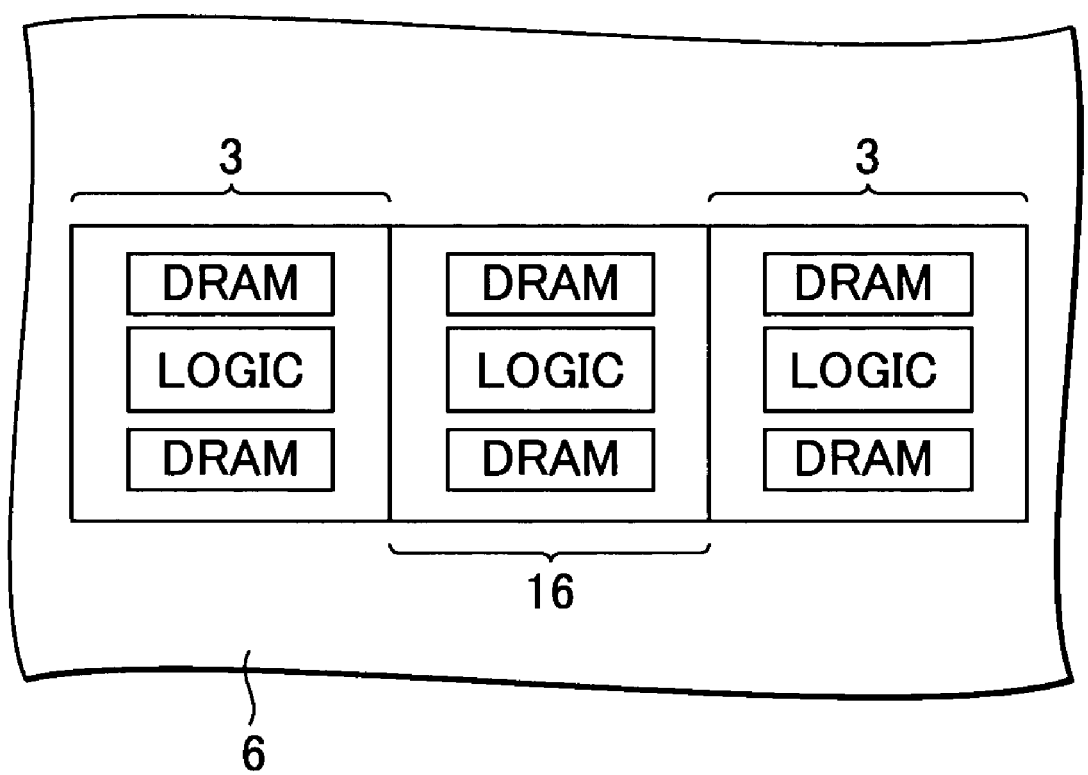
FIG. 8 is a schematic plan view of a stencil mask having dummy inspection areas according to a second embodiment of the invention.
Figure 9:
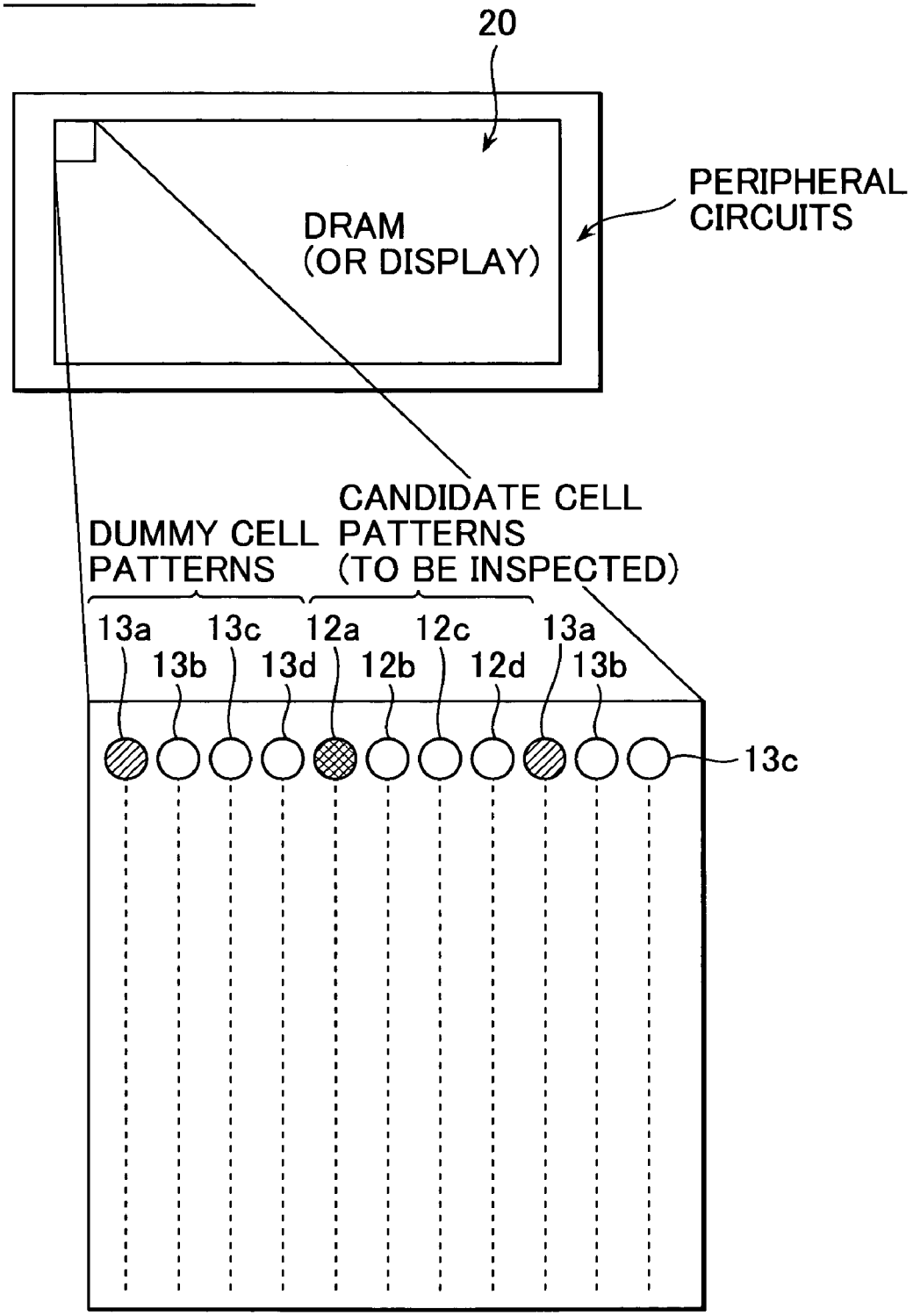
FIG. 9 is a schematic plan view and its partially enlarged view of a DRAM memory area in a mask pattern portion according to the second embodiment.
Figure 10A:
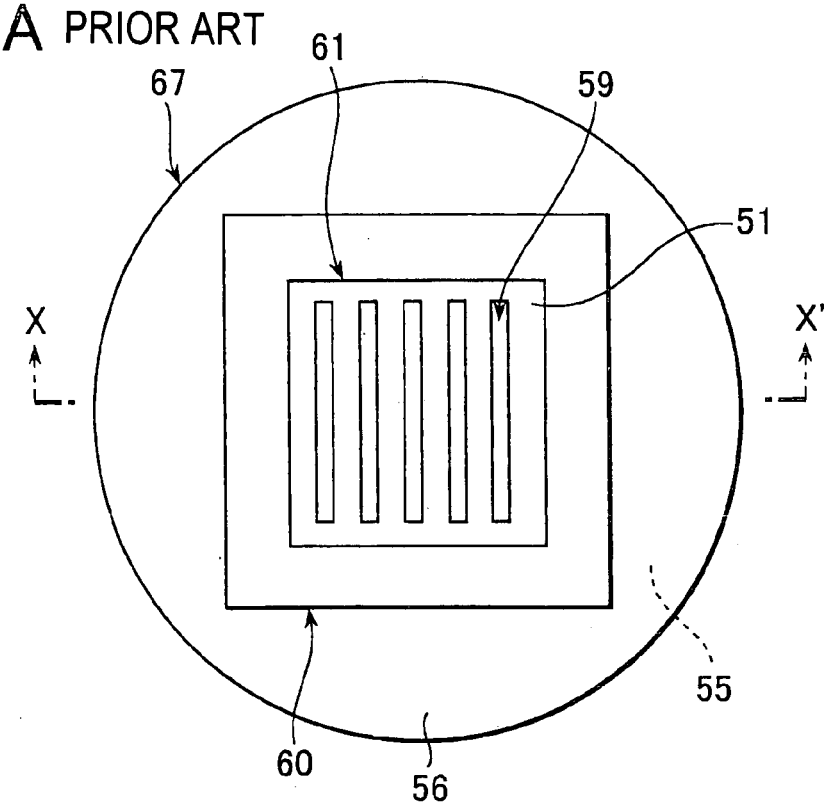
FIG. 10A is a schematic plan view of a conventional stencil mask.
Figure 10B:
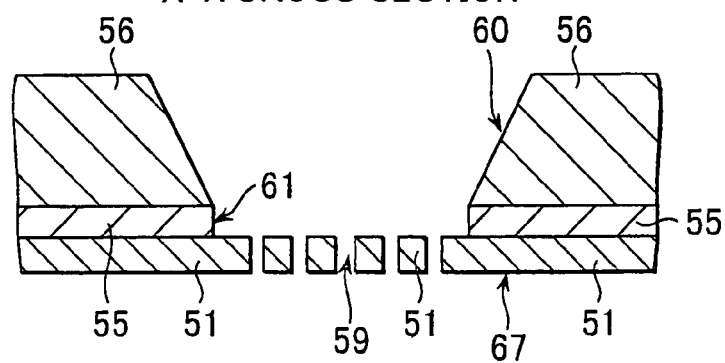
FIG. 10B is a cross sectional view taken along line X-X' shown in FIG. 10A.
Figure 11:
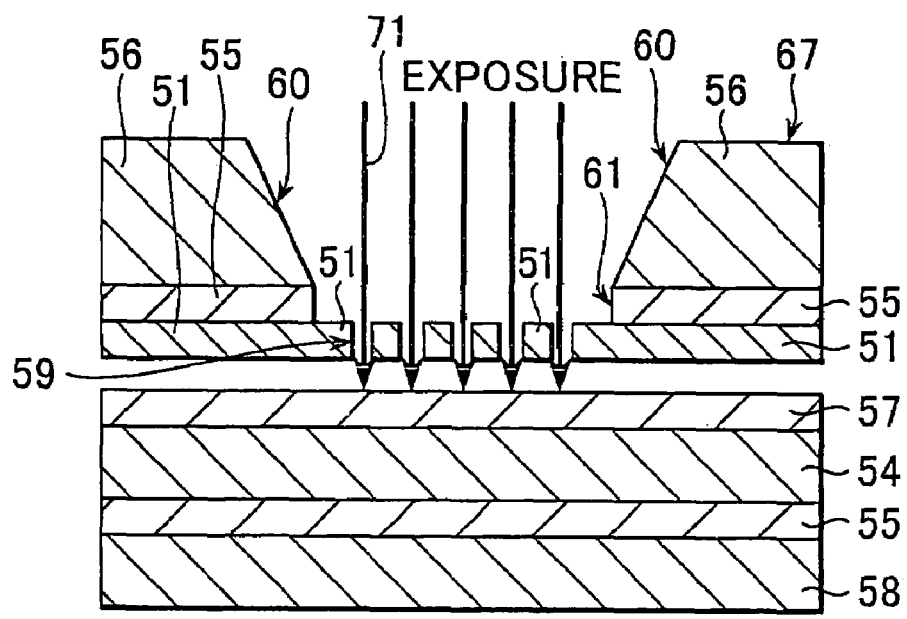
FIG. 11 is a cross sectional view illustrating an exposure process using a conventional stencil mask.
Figure 12A:
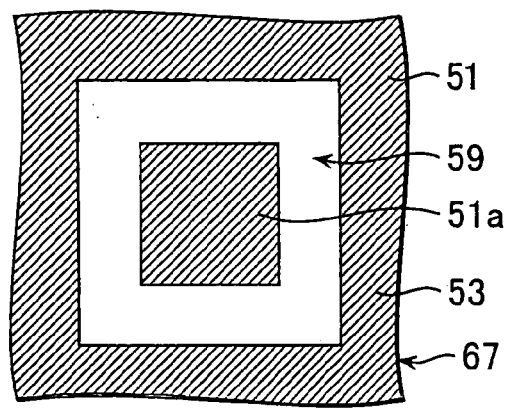
FIG. 12A is a plan view showing an example of an exposure pattern.
Figure 12B:
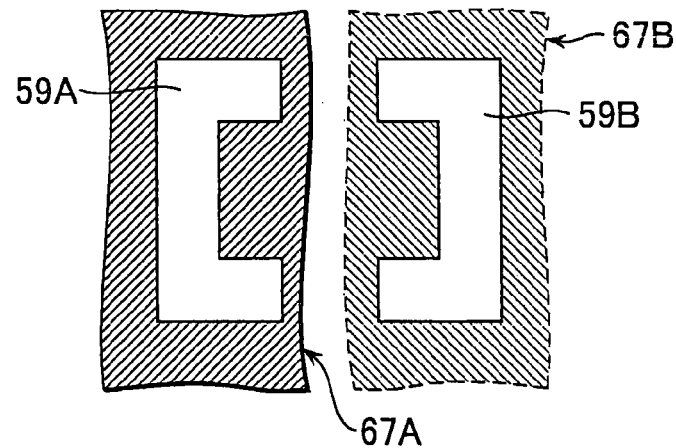
FIG. 12B is a plan view of complementary mask patterns.
Figure 12C:
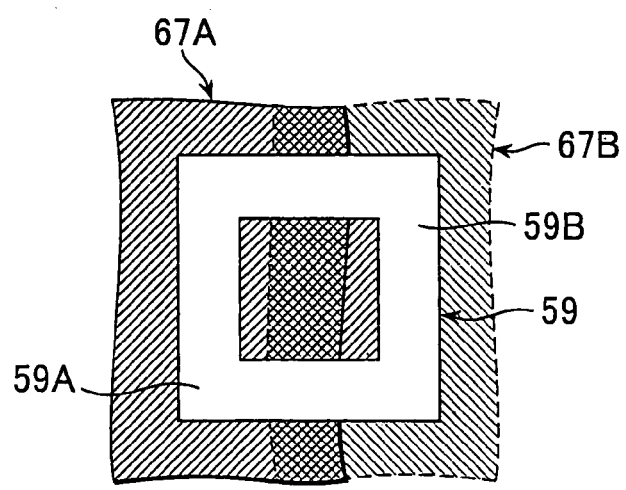
FIG. 12C is a plan view of overlaid complementary masks, according to conventional techniques.
Figure 13A:
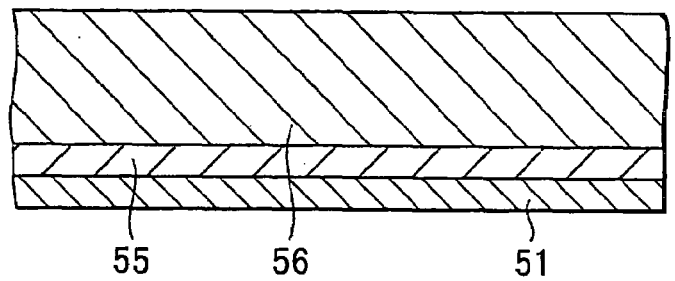
FIGS. 13A to 13C are cross sectional views sequentially illustrating conventional stencil mask fabrication processes.
Figure 13B:
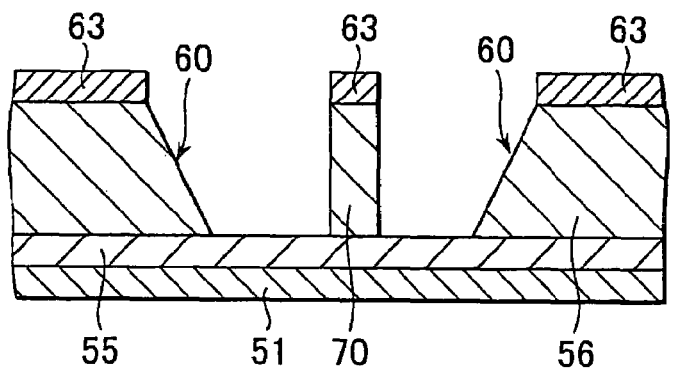
Figure 13C:
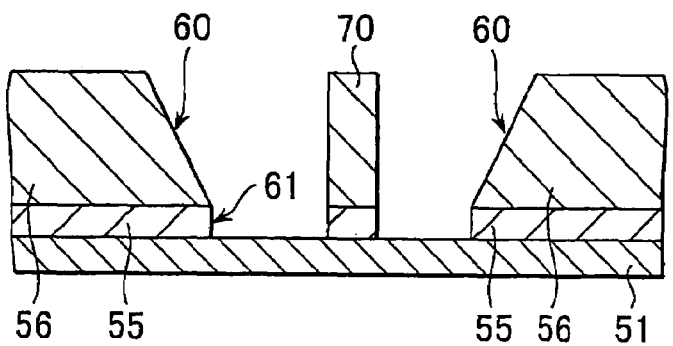
Figure 14A:
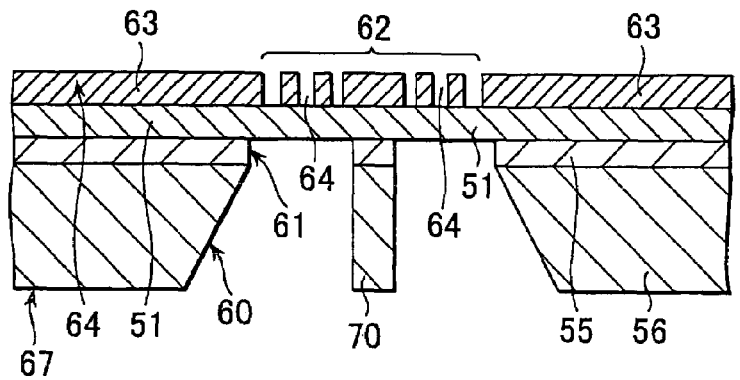
FIGS. 14A to 14C are cross sectional views sequentially illustrating conventional stencil mask fabrication processes.
Figure 14B:
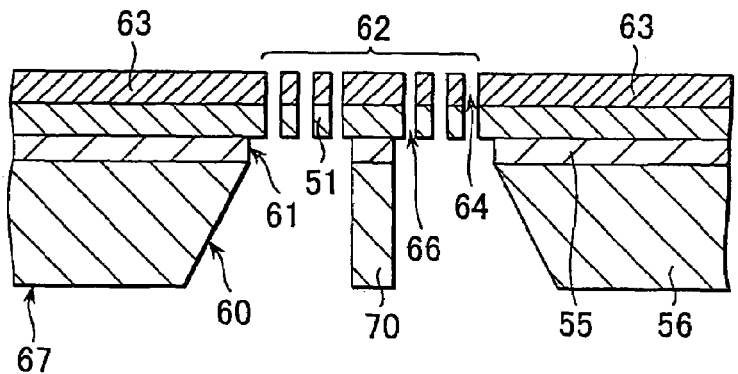
Figure 14C:
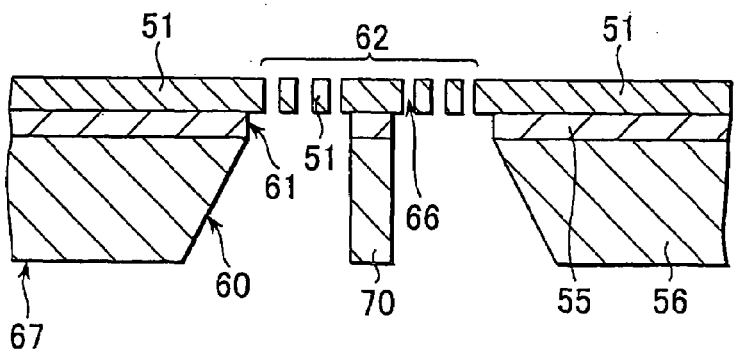
Figure 15:
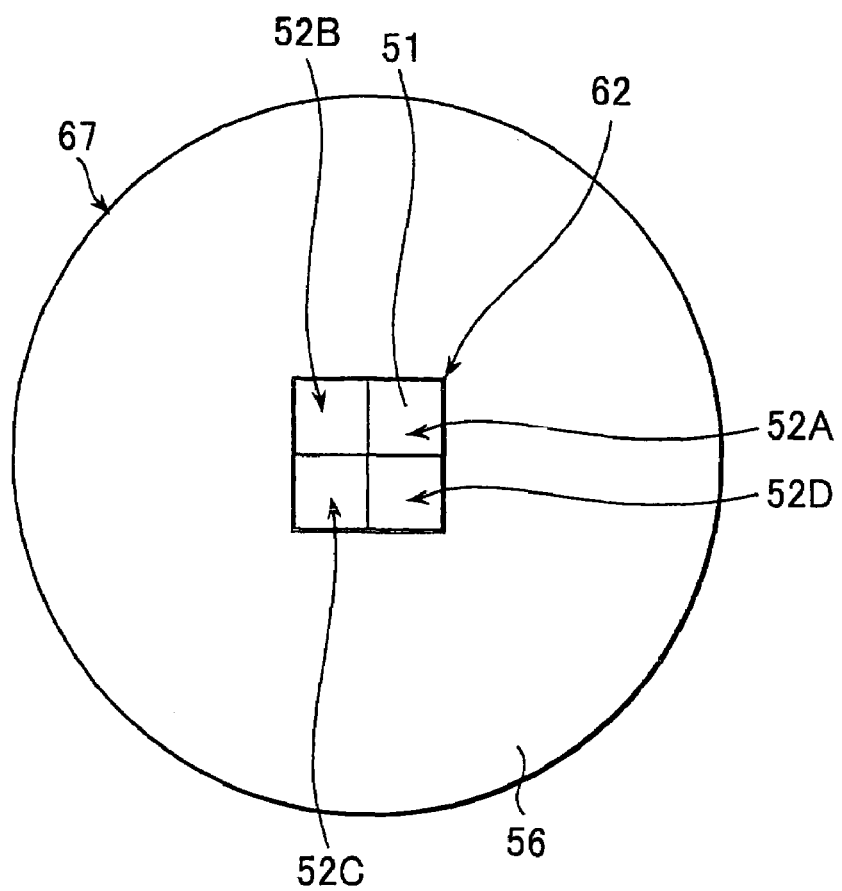
FIG. 15 is a plan view showing a conventional stencil mask.

The second embodiment as shown in FIGS. 8 and 9 is similar to the first embodiment, except that not only the chip comparison inspection (inspection by the Die to Die method) through comparison between the mask pattern portion 16 and dummy pattern portions 3 in constant with the mask pattern portion 16 can be performed, but also a cell comparison inspection (inspection by a "Cell to Cell" method) in the mask pattern portion 16 can be performed.

In the mask pattern portion 16 shown in FIG. 8, pattern openings are formed, for example, for DRAM (Dynamic Random Access Memory) devices constituted of memory cell groups and for LOGIC circuit devices. Defectiveness of memory cell groups of the DRAM devices having, for example, repetitive patterns is inspected through comparison by the Cell to Cell method in each DRAM device. Defectiveness of the LOGIC devices having no repetitive patterns is inspected through comparison by the Die to Die method that compares with the dummy LOGIC patterns of the right and left dummy inspection pattern portions 3 in the mask pattern portion 16.

More specifically, defectiveness of memory cell groups of the DRAM devices having repetitive patterns of the mask pattern portion 16 is inspected through cell comparison (inspection by the Cell to Cell method) between memory cells within each DRAM device. Since even fine memory cells can be inspected, the inspection sensitivity can be improved. It is also possible to inspect a defect of the DRAM devices or LOGIC devices in the mask pattern portion 16 through comparison inspection by the Die to Die method, by referring to the right and left dummy DRAM devices or dummy LOGIC devices in the dummy inspection pattern portions 3.

FIG. 9 is a schematic diagram illustrating comparison inspection by the Cell to Cell method and showing a partially enlarged view of a memory portion 20 of a DRAM device. The memory area 20 has a number of cells having the same pattern and disposed in a matrix shape. As schematically shown in an enlarged view, four types of dummy cell patterns 13a, 13b, 13c and 13d and four types of candidate cell patterns (to be inspected) 12a, 12b, 12c and 12d are alternately disposed at a predetermined distance or pitch. These patterns are all formed within the mask pattern portion 16.

Defect comparison inspection of a candidate cell pattern, e.g., candidate cell pattern 12a, in the memory portion 20, can be performed by using, for example, two dummy cell patterns 13a having the same pattern in the same row. Since the dummy cell patterns and candidate cell patterns are disposed at a predetermined pitch, comparison inspection between corresponding patterns can be performed reliably by designating coordinates of the patterns. Defect inspection for the other candidate cell patterns 12b, 12c and 12d can be performed in a similar manner.

Since defect inspection by the Cell to Cell method is possible for memory cells in each DRAM device within the mask pattern portion 16, the pattern inspection precision can be improved more than by the Die to Die method. The cell patterns judged good by the comparison inspection are used as masks. It is obvious that dummy cell patterns can be used as real patterns.

Although DRAMs are used by way of example, a display may be used. In this case, the pattern of each pixel in an image area can be subjected to comparison inspection in a similar manner.

In addition to the functions and advantages described above, the second embodiment also has the functions and advantages similar to those of the first embodiment.

The embodiments described above can be modified in various ways based upon the technical concept of the present invention.

For example, the shape, number, size, layout position and the like of dummy inspection pattern portions can be selected as desired by considering the mask pattern portion. As described earlier, although the dummy inspection pattern portion may be disposed outside the mask pattern portion or inside and outside the mask pattern portion, it may be disposed only inside the mask pattern.

It is preferable to use a number of dummy inspection pattern portions in order to improve the inspection precision of comparison with the mask pattern portion. Comparison inspection using the dummy inspection patterns may adopt the Die to Die method or the Cell to Cell method, together with the Die to Data method.

The stencil mask is not limited only to LEEPL, but stencil masks for EPL or IPL also may be used. The invention may be applied to various exposure patterns of electrodes, wirings, dielectric films and the like. In addition to the stencil masks for LEEPL, EPL and IPL, exposure masks (reticles) of other types also may be formed with the above-described dummy inspection patterns.

Finally, the embodiments and examples described above are only examples of the present invention. It should be noted that the present invention is not restricted only to such embodiments and examples, and various modifications, combinations and sub-combinations in accordance with its design or the like may be made without departing from the scope of the present invention.

What is claimed is:

1. An inspection method of inspecting an exposure pattern or mask for exposing a predetermined pattern by an exposure beam, comprising the steps of:

disposing a plurality of inspection pattern portions inside and/or outside a mask pattern portion of said exposure pattern or mask, said inspection pattern portion having a same pattern as at least a part of said mask pattern portion; and comparing said at least a part of said mask pattern portion with said inspection pattern portion or portions.

2. The inspection method according to claim 1, wherein the number of said inspection pattern portions is a twofold or more of the number of said at least a part of said mask pattern portion.

3. The inspection method according to claim 1, wherein said inspection pattern portions are disposed near said mask pattern portion.

4. The inspection method according to claim 1, wherein said mask pattern portion has through holes arranged to form a predetermined pattern through which said exposure beam transmits, and said inspection pattern portions have recesses arranged to form a corresponding pattern.

5. The inspection method according to claim 4, wherein said mask pattern portion is made of a thin film, and said inspection pattern portions are made of the thin film on a support member.

6. The inspection method according to claim 1, wherein said at least a part of said mask pattern and said inspection pattern portion or portions are optically detected and compared detected information.

7. The inspection method according to claim 1, wherein the inspection method is used for chip comparison inspection referred to as an inspection by a "Die to Die" method or cell comparison inspection referred to as an inspection by a "Cell to Cell" method.

8. A manufacture method of manufacturing an exposure pattern or mask for exposing a predetermined pattern by an exposure beam, comprising the steps of:

disposing a plurality of inspection pattern portions inside and/or outside a mask pattern portion of said exposure pattern or mask, said inspection pattern portion having a same pattern as at least a part of said mask pattern portion; and comparing said at least a portion of said mask pattern portion with said inspection pattern portion or portions.

9. The manufacture method according to claim 8, wherein the number of said inspection pattern portions is a twofold or more of the number of said at least a part of said mask pattern portion.

10. The manufacture method according to claim 8, wherein said inspection pattern portions are disposed near said mask pattern portion.

11. The manufacture method according to claim 8, wherein said mask pattern portion has through holes arranged to form a predetermined pattern through which said exposure beam transmits, and said inspection pattern portions have recesses arranged to form a corresponding pattern.

12. The manufacture method according to claim 11, wherein said mask pattern portion is made of a thin film, and said inspection pattern portions are made of the thin film on a support member.

13. The manufacture method according to claim 8, wherein said at least a portion of mask pattern and said inspection pattern portion or portions are optically detected and compared detected information.

14. The manufacture method according to claim 8, wherein a manufacture condition is controlled in accordance with said comparison result.

15. The manufacture method according to claim 8, wherein said manufacture method is used for chip comparison inspection referred to as an inspection by a "Die to Die" method or cell comparison inspection referred to as an inspection by a "Cell to Cell" method.

* * * * *